(12) United States Patent
Ispas et al.

(10) Patent No.: US 10,951,214 B1
(45) Date of Patent: Mar. 16, 2021

(54) SIGNAL ANALYSIS METHOD AND SIGNAL ANALYSIS MODULE

(71) Applicant: Rohde & Schwarz GmbH & Co. KG, Munich (DE)

(72) Inventors: Adrian Ispas, Munich (DE); Michael Reinhold, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 0 days.

(21) Appl. No.: 16/810,493

(22) Filed: Mar. 5, 2020

(51) Int. Cl.
*H04L 7/00* (2006.01)
*H03L 7/08* (2006.01)
*H04L 7/033* (2006.01)

(52) U.S. Cl.
CPC .......... *H03L 7/0807* (2013.01); *H04L 7/0331* (2013.01)

(58) Field of Classification Search
CPC .... H03L 7/0807; H04L 7/0331; H04L 7/0337
USPC ........................................ 375/355, 373, 371
See application file for complete search history.

(56) References Cited

U.S. PATENT DOCUMENTS

2005/0058234 A1* 3/2005 Stojanovic ............ H04L 7/0331
　　　　　　　　　　　　　　　　　　　　375/371
2007/0297551 A1* 12/2007 Choi ..................... H04L 7/0337
　　　　　　　　　　　　　　　　　　　　375/371

* cited by examiner

*Primary Examiner* — Phuong Phu
(74) *Attorney, Agent, or Firm* — Christensen O'Connor Johnson Kindness PLLC

(57) ABSTRACT

A signal analysis method for recovering a clock signal from an input signal is described. The input signal comprises a symbol sequence, wherein each symbol has one of N different amplitude values, and wherein N is an integer bigger than 1. The signal analysis method comprises the following steps: The input signal is received. Transition times of the input signal are determined, wherein the input signal respectively crosses one of several predetermined amplitude thresholds at the transition times. The transition times are transformed into one reference symbol period, thereby obtaining transformed transition times. The clock signal is determined based on the transformed transition times. Further, a signal analysis module for recovering a clock signal from an input signal is described.

16 Claims, 2 Drawing Sheets

SIGNAL ANALYSIS METHOD AND SIGNAL ANALYSIS MODULE

FIELD OF THE DISCLOSURE

Embodiments of the present disclosure generally relate to a signal analysis method for recovering a clock signal from an input signal. Embodiments of the present disclosure further relate to a signal analysis module for recovering a clock signal from an input signal.

BACKGROUND

Several serial transmission protocols, for example transmission protocols for high data rates, do not have a dedicated clock signal so that a clock data recovery (CDR) based on the data signal is required.

In the state of the art, clock data recovery is done by a phase-locked loop (PLL) based clock data recovery. Typically, analog components are used in order to avoid major delays in the feedbacks done by the PLL based clock recovery, which might have an impact on the function and stability of the respective system used for clock data recovery.

In addition, digital solutions for clock data recovery are known in the state of the art.

For instance, phase interpolation techniques are used wherein the phase or rather the phase position of the clock signal is corrected in a feedback-controlled manner. The phase information of the data signal as well as the one of the clock signal are compared and used for controlling a phase interpolation. Thus, the respective information gathered is used for reconstructing the clock signal. The phase interpolation techniques ensure to track frequency shifts, for instance frequency shifts that occur in spread spectrum clocking (SSC) modulations. However, the technique is critical with regard to latency due to the feedback.

Another concept is based on sampling the data signal with a high sampling rate in an uncontrolled manner, also called blind oversampling. Edges in the data signal are detected which are used for determining the sampling times for generating the clock signal and recovering the respective data. However, this approach may not be capable of recovering the clock in real time if the data signal has a high data rate.

Accordingly, there is a need for a possibility enabling clock data recovery for n-ary serial signals, e.g. PAM-n signals, at high data rates with a large area of application.

SUMMARY

Embodiments of the present disclosure provide a signal analysis method for recovering a clock signal from an input signal. The input signal may comprise a symbol sequence, wherein each symbol has one of N different amplitude values, and wherein N is an integer bigger than 1. In an embodiment, the signal analysis method comprises the following steps. The input signal is received. Transition times of the input signal are determined, wherein the input signal respectively crosses one of several predetermined amplitude thresholds at the transition times. The transition times are transformed into one reference symbol period, thereby obtaining transformed transition times. The clock signal is determined based on the transformed transition times.

The signal analysis method according to the disclosure is based on the idea to provide a clock data recovery for n-ary signals, e.g. PAM-n, wherein a feed-forward structure is used instead of a feedback structure being critical with regard to latency issues such as a phase-locked loop. In addition, data signals with jitter, frequency shifts or larger frequency variations can be processed appropriately, for instance spread spectrum clocking (SSC) modulated signals. Moreover, data rates higher than 10 Gbps at system clock rates of 250 MHz can be achieved.

A bit is symbol of a 2-ary symbol having the states '0' or '1'. For n-ary signals, e.g. PAM4, each symbol can have one of n different symbol values, e.g. four.

The transition times are associated with signal edge times of the input signal. However, the transition times and the associated signal edge times do not have to be equal. The signal edge times can rather be determined based on the associated transition times.

The transformation of the transition relates to a modulo transformation allowing a statistical evaluation of the transition times within a symbol period. Put another way, the transition times are transformed into one symbol period interval for further evaluation by applying the respective modulo transformation.

The symbol period used may be set, for example pre-set initially.

In order to determine the clock signal, a time offset for the reference symbol period may be chosen from a number of time offset values wherein the time offset chosen corresponds to a base value for the clock signal. The respective time offset is chosen by applying a criterion that shall be fulfilled, for instance an argument of minimum, also called arg min.

Once the time offset used as the base value has been chosen, a reference clock signal may be determined based on the time offset. For instance, the time offset chosen is used to determine the last transition time within a system clock of the signal analysis circuit or module by taking the symbol period into account so as to determine the reference clock signal.

It is noted that transforming the transition times into a single symbol period and evaluating the transformed transition times statistically is equivalent to determining at least one histogram of the transition times, wherein the at least one histogram is associated with a preliminary set of clock timings, and wherein the clock signal is then determined based on the histogram.

Generally speaking, the at least one histogram indicates deviations of the clock timings from their supposed temporal position. More precisely, the at least one histogram is a distribution of the frequentness of deviations of the clock signals from their supposed temporal position plotted against the value of the deviation.

The preliminary set of clock timings represents a hypothesis about the clock signal. If this hypothesis matches timings defined by the transition times, for example the signal edge times themselves, the mean deviation, for example a mean absolute error and/or a mean quadratic error, of the clock timings from their supposed temporal position is smaller than in the case if the hypothesis does not match the timings defined by the transition times. Thus, the histogram changes depending on how well the hypothesis matches the timings defined by the transition times.

According to an aspect of the present disclosure, the predetermined amplitude thresholds comprise central amplitude thresholds, lower amplitude thresholds and upper amplitude thresholds. Based on the central amplitude thresholds, lower amplitude thresholds and upper amplitude thresholds, a hysteresis for symbol transitions of the input signal can be implemented, for example in a subsequent decoding of the input signal. Depending on whether the input signal amplitude is rising or falling another one of the central amplitude thresholds, the lower amplitude thresholds and the upper amplitude thresholds is taken into account in order to determine a symbol value transition of the input signal. This way, fluctuations of the symbol value of the input signal during crossing of the amplitude threshold are prevented.

In some embodiments, a change of symbol value for a rising input signal amplitude is only acknowledged if the input signal crosses one of the upper amplitude thresholds. Accordingly, a change of symbol value for a falling input signal amplitude is only acknowledged if the input signal crosses one of the lower amplitude thresholds.

According to another aspect of the present disclosure, the predetermined amplitude thresholds are arranged in groups consisting of one central amplitude threshold, one lower amplitude threshold, and one upper amplitude threshold. Therein, a distance between individual members of one group is much smaller than a distance between members of different groups. In other words, the individual members of a group are located close to each other.

In a further embodiment of the present disclosure, the input signal is decoded based on the clock signal, thereby obtaining a decoded input signal. In other words, the symbol values of the symbols comprised in the input signal are determined. Thus, the data comprised in the input signal is recovered.

In some embodiments, transition times corresponding to a common symbol transition are determined based on the decoded input signal. If the amplitude value of two consecutive symbols differs by more than one level, the input signal crosses more than one of the predetermined amplitude thresholds. In some embodiments, the input signal crosses several ones of the central amplitude thresholds, the lower amplitude thresholds and the upper amplitude thresholds. For several, for example for all of these crossings of the predefined amplitude thresholds corresponding to a common symbol transition, the respective transition times are determined and may be taken into account in order to determine the clock signal.

According to another aspect of the present disclosure, centered transition times are determined respectively based on the transition times corresponding to the common symbol transition. In other words, instead of transforming all transition times that correspond to a common symbol transition time into the reference symbol period, the respective centered transition times are determined. The centered transition times may then be transformed into the reference symbol period in order to determine the clock signal (in a more accurate manner).

Thus, for each signal edge, all timings that correspond to that signal edge are taken into account in order to determine the correct timing of the respective signal edge. For signal edges corresponding to a transition between symbols that are more than one level apart, there are at least two transition times involved. The centered transition time for that particular signal edge is determined based on the transition times associated with that signal edge. If, however, two consecutive symbols are only one level apart, the respective transition time may be equal to the centered transition time.

Generally speaking, the centered transition times reflect the symbol transition time more accurately than the transition times that are based on the predefined amplitude thresholds. Accordingly, the accuracy of the subsequent determination of the clock signal is enhanced.

In a further embodiment of the present disclosure, the transition times corresponding to the common symbol transition are interpolated in order to determine at least one of the centered transition times. In some embodiments, the transition times are linearly interpolated in order to determine the at least one centered transition time.

For example, an average of the transition times corresponding to the common symbol transition may be computed in order to determine the at least one centered transition time.

According to an aspect of the present disclosure, an improved clock signal is determined based on at least one of the centered transition times. As already mentioned above, the centered transition times reflect the position of signal edges more accurately. Accordingly, also the clock signal determined based in the centered transition times, i.e. the improved clock signal, is more accurate.

According to another aspect of the present disclosure, the centered transition times are transformed into one reference symbol period, thereby obtaining transformed centered transition times, and wherein the improved clock signal is determined based on the transformed centered transition times. The centered transition times are transformed into the reference symbol period analogously to the transformation of the transition times into the reference period described above. Accordingly, the remarks and explanations given above with respect to the transformation of the transition times also apply to the centered transition times. The improved clock signal corresponds to the more accurately determined one.

In a further embodiment of the present disclosure, the transformed centered transition times are interpolated in order to determine the improved clock signal. In some embodiments, the transition times are linearly interpolated in order to determine the improved clock signal.

Embodiments of the present disclosure further provide a signal analysis circuit(s) or module for recovering a clock signal from an input signal. The signal analysis module comprises an input being configured to receive an input signal. The analysis module comprises a threshold circuit(s) or module being configured to determine transition times of the input signal, wherein the input signal respectively crosses one of several predetermined amplitude thresholds at the transition times. The analysis module further comprises a transformation circuit(s) or module being configured to transform the transition times into one reference symbol period, thereby obtaining transformed transition times. The analysis module further comprises a clock recovery circuit(s) or module being configured to determine the clock signal based on the transformed transition times.

The signal analysis circuit(s) or module may be established as pure software, as pure hardware and/or as a combination of software and hardware.

Regarding the further properties and advantages of the signal analysis module, reference is made to the explanations given above with respect to the signal analysis method, which also apply to the signal analysis module and vice versa.

According to an aspect of the present disclosure, the predetermined amplitude thresholds comprise central amplitude thresholds, lower amplitude thresholds and upper amplitude thresholds. Based on the central amplitude thresholds, lower amplitude thresholds and upper amplitude thresholds, a hysteresis of the input signal can be implemented, for example in a subsequent decoding of the input signal. Depending on whether the input signal amplitude is rising or falling another one of the central amplitude thresholds, the lower amplitude thresholds and the upper amplitude thresholds is taken into account in order to determine a symbol value transition of the input signal. This way, fluctuations of the symbol value of the input signal during crossing of the amplitude threshold are prevented.

In some embodiments, a change of symbol value for a rising input signal amplitude is only acknowledged if the input signal crosses one of the upper amplitude thresholds. Accordingly, a change of symbol value for a falling input signal amplitude is only acknowledged if the input signal crosses one of the lower amplitude thresholds.

The predetermined amplitude thresholds may be arranged in groups consisting of one central amplitude threshold, one lower amplitude threshold, and one upper amplitude threshold. Therein, a distance between individual members of one group is much smaller than a distance between members of different groups. In other words, the individual members of a group are located close to each other.

In a further embodiment of the present disclosure, the signal analysis module further comprises a decoder circuit(s) or module being configured to decode the input signal based on the clock signal, thereby obtaining a decoded input signal. In other words, the symbol values of the symbols comprised in the input signal are determined by the decoder module. Thus, the data comprised in the input signal is recovered.

According to another aspect of the present disclosure, the signal analysis module further comprises a second threshold circuit(s) or module, wherein the second threshold module is configured to determine transition times corresponding to a common symbol transition based on the decoded input signal. If the amplitude value of two consecutive symbols differs by more than one level, the input signal crosses more than one of the predetermined amplitude thresholds. In some embodiments, the input signal crosses several ones of the central amplitude thresholds, the lower amplitude thresholds and the upper amplitude thresholds. For several, for example for all of these crossings of the predefined amplitude thresholds corresponding to a common symbol transition, the respective transition times are determined and may be taken into account in order to determine the clock signal.

The second threshold module may be configured to determine centered transition times respectively based on the transition times corresponding to the common symbol transition. In other words, instead of transforming all transition times that correspond to the common symbol transition time into the reference symbol period, the respective centered transition times are determined. The centered transition times may then be transformed into the reference symbol period in order to determine the clock signal (more accurately).

Thus, for each signal edge all timings that correspond to that signal edge are taken into account in order to determine the correct timing of the respective signal edge. For signal edges corresponding to a transition between symbols that are more than one level apart, there are at least two transition times involved. The centered transition time for that particular signal edge is determined based on the transition times associated with that signal edge. If, however, two consecutive symbols are only one level apart, the respective transition time may be equal to the centered transition time.

Generally speaking, the centered transition times reflect the symbol transition time more accurately than the transition times that are based on the predefined amplitude thresholds. Accordingly, the accuracy of the subsequent determination of the clock signal is enhanced.

According to another aspect of the present disclosure, the second threshold module is configured to interpolate the transition times corresponding to the common symbol transition in order to determine at least one of the centered transition timed. In some embodiments, the transition times are linearly interpolated in order to determine the at least one centered transition time.

For example, an average of the transition times corresponding to the common symbol transition may be computed in order to determine at least one of the centered transition times.

The signal analysis module may further comprise a second clock recovery circuit(s) or module, the second clock recovery module being configured to determine an improved clock signal based on the at least one centered transition time. As already mentioned above, the centered transition times reflect the position of signal edges more accurately. Accordingly, also the clock signal determined based in the centered transition times, i.e. the improved clock signal, is more accurate.

According to a further embodiment of the present disclosure, the second clock recovery module is configured to transform the centered transition times into one reference symbol period, thereby obtaining transformed centered transition times, and wherein the second clock recovery module is configured to determine the improved clock signal based on the transformed centered transition times. The centered transition times are transformed into the reference symbol period analogously to the transformation of the transition times into the reference period described above. Accordingly, the remarks and explanations given above with respect to the transformation of the transition times also apply to the centered transition times.

In some embodiments, the second clock recovery module is configured to interpolate the transformed centered transition times in order to determine the improved clock signal. In some embodiments, the transition times are linearly interpolated in order to determine the improved clock signal.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
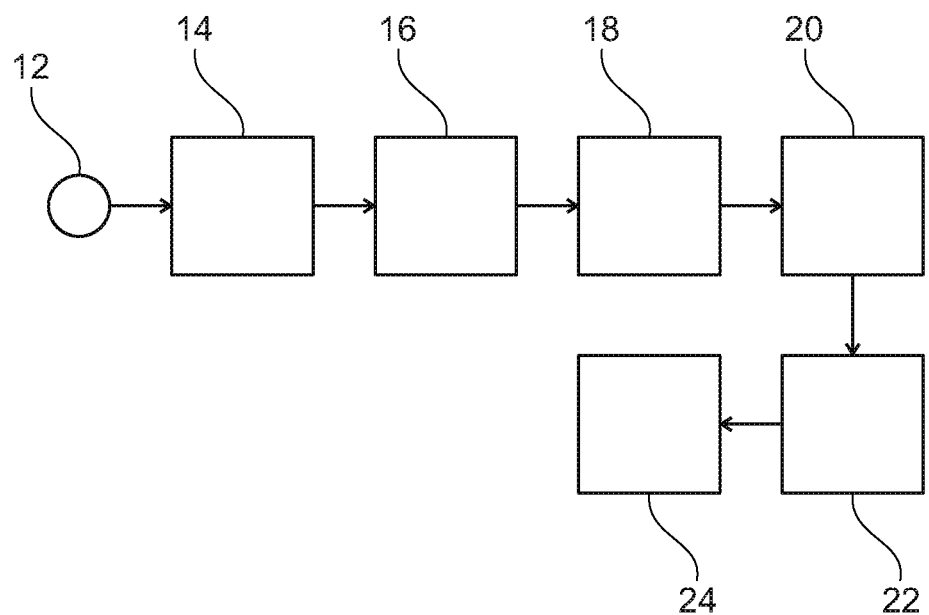
FIG. 1 shows a block diagram of a signal analysis module according to an embodiment of the disclosure.

FIG. 1 shows a block diagram of a signal analysis circuit(s) or module 10. The signal analysis module 10 comprises an input 12, a threshold circuit(s) or module 14, a transformation circuit(s) or module 16, a clock recovery circuit(s) or module 18, a decoder, such as a decoder circuit(s) or module 20, a second threshold circuit(s) or module 22, and a second clock recovery circuit(s) or module 24.

As used herein, the term "module" is understood to denote components that comprise suitable hardware and/or software. Thus, the term "module" comprises the meanings "pure software", "pure hardware" and "combination of software and hardware", as will be appreciated by the person skilled in the art.

Generally, the signal analysis module 10 may be part of a measurement instrument, for example of an oscilloscope or of a vector network analyzer.

In the context of the present disclosure, the terms "downstream" and "upstream" are understood to denote directions of signal propagation within the signal analysis module 10, wherein electrical signals propagate from the upstream component to the downstream component. In FIG. 1, the directions of signal propagation are indicated by the respective arrows.

The threshold module 14 is connected to the input 12 downstream of the input 12. The transformation module 16 is connected to the threshold module 14 downstream of the threshold module 14. The cock recovery module 18 is connected to the transformation module 16 downstream of the transformation module 16. The decoder module 20 is connected to the clock recovery module 18 downstream of the clock recovery module 18. The second threshold module 22 is connected to the decoder module 20 downstream of the decoder module 20. The second clock recovery module 24 is connected to the second threshold module 22 downstream of the second threshold module 22.

Figure 2:
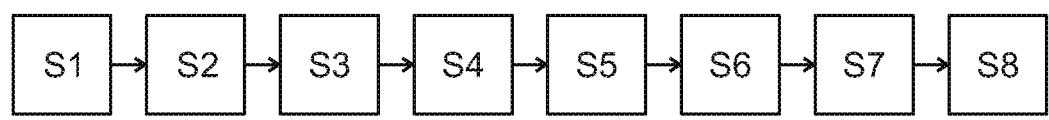
FIG. 2 shows a flow chart of a signal analysis method according to an embodiment of the disclosure.

The signal analysis module 10 is configured to perform the signal analysis method described in the following with reference to FIG. 2.

An input signal is received via the input 12 (step S1). The input signal comprises a symbol sequence, wherein each symbol has one of N different amplitude values, and wherein N is an integer bigger than 1. In other words, the input signal is established as a PAM-N coded signal.

The input signal is forwarded to the threshold module 14, which determines transition times of the input signal (step S2). Generally speaking, the transition times correspond to times at which the amplitude of the input signal crosses one of several different predefined amplitude thresholds.

Figure 3:
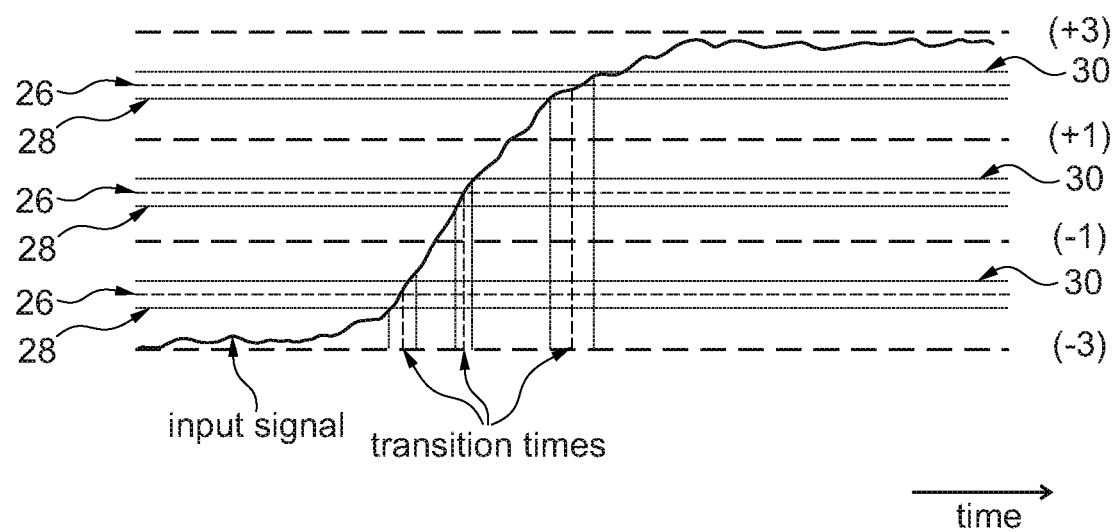
FIG. 3 schematically shows a diagram of an amplitude of an input signal plotted against time.

Step S2 is illustrated in FIG. 3, which shows a diagram of the amplitude of the input signal plotted against time, wherein a PAM-4 coded input signal is used as an example for illustration. There, the four different amplitude levels of the input signal have the values −3, −1, 1, and 3.

For a PAM-N coded signal, there are (N−1) central amplitude thresholds 26 that separate the N levels from their respective neighbor levels. Accordingly, for the PAM-4 coded signal, there are three different central amplitude thresholds 26.

Additionally to the central amplitude thresholds 26, lower amplitude thresholds 28 and upper amplitude thresholds 30 may be provided. Therein, one lower amplitude threshold 28 and one upper amplitude threshold 30 is provided for each of the central amplitude thresholds 26.

The predetermined amplitude thresholds 26, 28, 30 are arranged in groups comprising, consisting of, or consisting essentially of one central amplitude threshold 26, one lower amplitude threshold 28, and one upper amplitude threshold 30. Therein, a distance between individual members of one group is much smaller than a distance between members of different groups. In other words, the individual members of a group are located close to each other.

The threshold module 14 determines the times at which the amplitude of the input signal crosses the central amplitude thresholds 26, i.e. the transition times in step S2 correspond only to these times.

Alternatively or additionally, the transition times corresponding to the times at which the input signal crosses the lower amplitude thresholds 28 and/or the upper amplitude thresholds may also be taken into account.

The transition times are forwarded to the transformation module 16, which transforms the transition times into a reference symbol period, thereby obtaining transformed transition times (step S3).

Figure 4:
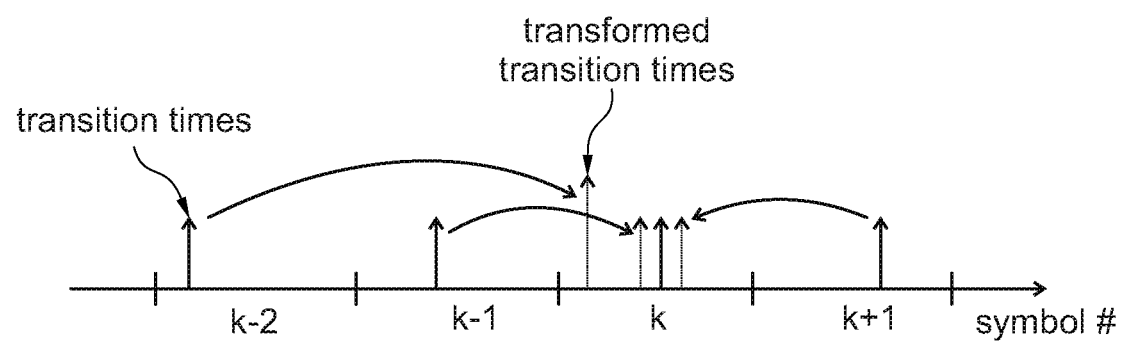
FIG. 4 shows an overview illustrating a processing step of the method shown in FIG. 2.

Step S3 is illustrated in FIG. 4. There, all transition times are transformed into the symbol period k.

This may be done by a modulo transformation, wherein a time $\Delta t_i = c_i \cdot t_{ref}$ is added to all transition times. Therein, $c_i$ is a coefficient that depends on the number i of the respective symbol, and that may be positive or negative as required. $t_{ref}$ corresponds to a hypothesis about the symbol duration of the input signal. In other words, a hypothesis for a base value of the clock signal. $t_{ref}$ may be preset or may, alternatively, be estimated based on the input signal.

It is noted that transforming the transition times into a single symbol period and evaluating the transformed transition times statistically is equivalent to determining at least one histogram of the transition times, wherein the at least one histogram is associated with a preliminary set of clock timings, and wherein the clock signal is then determined based on the histogram.

Generally speaking, the at least one histogram indicates deviations of the clock timings from their supposed temporal position. More precisely, the at least one histogram is a distribution of the frequentness of deviations of the clock signals from their supposed temporal position plotted against the value of the deviation.

The preliminary set of clock timings represents a hypothesis about the clock signal. If this hypothesis matches timings defined by the transition times, for example the signal edge times themselves, the mean deviation, for example a mean absolute error and/or a mean quadratic error, of the clock timings from their supposed temporal position is smaller than in the case if the hypothesis does not match the timings defined by the transition times. Thus, the histogram changes depending on how well the hypothesis matches the timings defined by the transition times.

The transformed transition times are forwarded to the clock recovery module 18, which determines a clock signal based on the transformed transition times (step S4). In other words, the clock recovery module 18 recovers the clock signal underlying the input signal based on the transformed transition times.

The clock recovery module 18 may evaluate the transformed transition times with statistical techniques in order to obtain the clock signal. However, as will be explained in the following, the clock signal determined by the clock recovery module 18 is not the final clock signal that is obtained by the signal analysis module 10. Accordingly, the clock signal recovered by the clock recovery module 18 is called "preliminary clock signal" in the following.

The preliminary clock signal is forwarded to the decode module 20, which decodes the input signal based on the preliminary clock signal, thereby obtaining a decoded input signal (step S5). Thus, the symbol values of the symbols comprised in the input signal are determined, such that the data comprised in the input signal is recovered.

The decoded input signal is forwarded to the second threshold module 22, which determines transition times corresponding to a common symbol transition (step S6).

As is illustrated in FIG. 3, the input signal crosses more than one of the predetermined amplitude thresholds if the amplitude value of two consecutive symbols differs by more than one level.

In some embodiments, the input signal crosses several ones of the central amplitude thresholds, the lower amplitude thresholds and the upper amplitude thresholds. For several, for example for all of these crossings of the predefined amplitude thresholds corresponding to a common symbol transition, the respective transition times are determined.

Accordingly, in step S6, also the lower amplitude thresholds 28 and the upper amplitude thresholds 30 are taken into account.

The second threshold module 24 determines centered transition times respectively based on the transition times corresponding to a common symbol transition (step S7). The transition times may be interpolated in order to determine the centered transition times, for example linearly interpolated. For example, an average of the transition times corresponding to a common symbol transition may be computed in order to determine the centered transition times. The centered transition times reflect the respective signal edge times more accurately than the transition times determined before.

Thus, for each signal edge all transition timings that correspond to that signal edge are taken into account in order to determine the correct timing of the respective signal edge. For signal edges corresponding to a transition between symbols that are more than one level apart, there are at least two transition times involved. The centered transition time for that particular signal edge is determined based on the transition times associated with that signal edge. If, however, two consecutive symbols are only one level apart, the respective transition time may be equal to the centered transition time.

The centered transition times are forwarded to the second clock recovery module 26, which determines an improved clock signal based on the centered transition times (step S8).

Analogously to the steps S3 and S4 described above, the centered transition times may be transformed into a reference symbol period and the resulting transformed centered transition times may be statistically evaluated in order to determine the improved clock signal.

The explanations given above with respect to steps S3 and S4 also apply, mutatis mutandis, to step S8.

The second clock recovery module 24 may interpolate the transformed centered transition times in order to determine the improved clock signal, for example via a linear interpolation. Moreover, the second clock recovery module 24 may remove jitter components in order to determine the improved clock signal. This may, e.g., be achieved by applying a mathematical model of one or several jitter components to the centered transition times, such that the at least one jitter component can be determined and removed.

Certain embodiments disclosed herein utilize circuitry (e.g., one or more circuits) in order to implement protocols, methodologies or technologies disclosed herein, operably couple two or more components, generate information, process information, analyze information, generate signals, encode/decode signals, transform signals, convert signals, transmit and/or receive signals, control other devices, etc. Circuitry of any type can be used.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors or portions thereof and accompanying software, firmware, hardware, and the like.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A signal analysis method for recovering a clock signal from an input signal, wherein said input signal comprises a symbol sequence, wherein each symbol has one of N different amplitude values, and wherein N is an integer bigger than 1, said signal analysis method comprising:
receiving said input signal;
determining transition times of the input signal, wherein the input signal respectively crosses one of several predetermined amplitude thresholds at said transition times;
transforming said transition times into one reference symbol period, thereby obtaining transformed transition times; and
determining said clock signal based on said transformed transition times, wherein said input signal is decoded based on said clock signal, thereby obtaining a decoded input signal, and wherein centered transition times are determined respectively based on said transition times corresponding to a common symbol transition.

2. The signal analysis method of claim 1, wherein said predetermined amplitude thresholds comprise central amplitude thresholds, lower amplitude thresholds and upper amplitude thresholds.

3. The signal analysis method of claim 2, wherein said predetermined amplitude thresholds are arranged in groups consisting of one central amplitude threshold, one lower amplitude threshold, and one upper amplitude threshold.

4. The signal analysis method of claim 1, wherein centered transition times are determined respectively based on said transition times corresponding to said common symbol transition.

5. The signal analysis method of claim 4, wherein said transition times corresponding to said common symbol transition are interpolated in order to determine at least one of said centered transition times.

6. The signal analysis method of claim 4, wherein an improved clock signal is determined based on at least one of said centered transition times.

7. The signal analysis method of claim 6, wherein said centered transition times are transformed into one reference symbol period, thereby obtaining transformed centered transition times, and wherein said improved clock signal is determined based on said transformed centered transition times.

8. The signal analysis method of claim 7, wherein said transformed centered transition times are interpolated in order to determine said improved clock signal.

9. A signal analysis apparatus for recovering a clock signal from an input signal, said signal analysis apparatus comprising:
an input being configured to receive an input signal;
a threshold circuit configured to determine transition times of said input signal, wherein said input signal respectively crosses one of several predetermined amplitude thresholds at said transition times;
a transformation circuit configured to transform said transition times into one reference symbol period, thereby obtaining transformed transition times, and
a clock recovery circuit configured to determine said clock signal based on said transformed transition times,
a decoder circuit configured to decode said input signal based on said clock signal, thereby obtaining a decoded input signal, and
a second threshold circuit configured to determine transition times corresponding to a common symbol transition based on said decoded input signal.

10. The signal analysis apparatus of claim 9, wherein said predetermined amplitude thresholds comprise central amplitude thresholds, lower amplitude thresholds and upper amplitude thresholds.

11. The signal analysis apparatus of claim 10, wherein the predetermined amplitude thresholds are arranged in groups comprising one central amplitude threshold, one lower amplitude threshold, and one upper amplitude threshold.

12. The signal analysis apparatus of claim 9, wherein said second threshold module circuit is configured to determine centered transition times respectively based on said transition times corresponding to said common symbol transition.

13. The signal analysis apparatus of claim 12, wherein said second threshold circuit is configured to interpolate said transition times corresponding to said common symbol transition in order to determine at least one of said centered transition times.

14. The signal analysis apparatus of claim 12, further comprising a second clock recovery circuit configured to determine an improved clock signal based on at least one of said centered transition times.

15. The signal analysis apparatus of claim 14, wherein said second clock recovery circuit is configured to transform said centered transition times into one reference symbol period, thereby obtaining transformed centered transition times, and wherein said second clock recovery circuit is configured to determine said improved clock signal based on said transformed centered transition times.

16. The signal analysis apparatus of claim 15, wherein said second clock recovery circuit is configured to interpolate said transformed centered transition times in order to determine said improved clock signal.

* * * * *

UNITED STATES PATENT AND TRADEMARK OFFICE
CERTIFICATE OF CORRECTION

PATENT NO. : 10,951,214 B1  
APPLICATION NO. : 16/810493  
DATED : March 16, 2021  
INVENTOR(S) : A. Ispas et al.

Page 1 of 1

It is certified that error appears in the above-identified patent and that said Letters Patent is hereby corrected as shown below:

In the Claims

| Column | Line | Claim | |
|--------|------|-------|---|
| 12 | 28 | 12 | change "threshold module circuit" to -- threshold circuit -- |

Signed and Sealed this  
First Day of August, 2023

Katherine Kelly Vidal  
*Director of the United States Patent and Trademark Office*